United States Patent
Oh et al.

(10) Patent No.: US 8,400,174 B2
(45) Date of Patent: Mar. 19, 2013

(54) METHOD OF CORRECTING A POSITION OF A PROBER

(75) Inventors: Seung-Yong Oh, Suwon-si (KR);
Byoung Joo Kim, Hwaseong-si (KR);
Dae-Gab Chi, Yongin-si (KR); Ki-Yoon Kim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 301 days.

(21) Appl. No.: 12/656,520

(22) Filed: Feb. 2, 2010

(65) Prior Publication Data
US 2010/0194418 A1 Aug. 5, 2010

(30) Foreign Application Priority Data
Feb. 3, 2009 (KR) .................. 10-2009-0008227

(51) Int. Cl.
*G01R 31/00* (2006.01)
(52) U.S. Cl. ........... 324/750.16; 324/754.1; 324/754.11; 324/756.03
(58) Field of Classification Search ............... 324/754.1, 324/754.11, 750.16
See application file for complete search history.

(56) References Cited

U.S. PATENT DOCUMENTS

| | | | | |
|---|---|---|---|---|
| 5,436,571 A * | 7/1995 | Karasawa | ................ | 324/750.19 |
| 5,644,245 A | 7/1997 | Saitoh et al. | | |
| 7,449,903 B2 * | 11/2008 | Huebner | .................. | 324/754.11 |
| 7,477,064 B2 * | 1/2009 | Kurihara et al. | ......... | 324/750.16 |
| 7,501,843 B2 * | 3/2009 | Takahashi et al. | ....... | 324/750.19 |
| 7,589,544 B2 * | 9/2009 | Nakayama | ............... | 324/750.23 |
| 7,719,297 B2 * | 5/2010 | Takabe et al. | ............. | 324/762.06 |
| 7,791,364 B2 * | 9/2010 | Narita et al. | ............. | 324/755.11 |
| 8,013,621 B2 * | 9/2011 | Sano et al. | ............... | 324/750.23 |
| 8,054,097 B2 * | 11/2011 | Lin et al. | .................. | 324/762.03 |
| 2005/0099196 A1 * | 5/2005 | Sasaki | .......................... | 324/754 |

FOREIGN PATENT DOCUMENTS

| | | | |
|---|---|---|---|
| JP | 06-318622 A | 11/1994 | |
| JP | 2007-103860 A | 4/2007 | |
| KR | 10-0284558 B1 | 12/2000 | |
| KR | 10-2006-0124559 A | 12/2006 | |

* cited by examiner

*Primary Examiner* — Richard Isla Rodas
(74) *Attorney, Agent, or Firm* — Lee & Morse, P.C.

(57) ABSTRACT

A method of correcting a position of a prober, the method including obtaining a first image of a pad, the pad having a predetermined reference contact position, contacting the prober to the pad after obtaining the first image of the pad, obtaining a second image of the pad after contacting the prober to the pad, determining an actual contact position of an actual contact mark on the pad, the actual contact mark being produced by the contacting of the prober to the pad, comparing the second image to the first image to obtain an offset data, the offset data relating the actual contact position to the reference contact position, and correcting the position of the prober by aligning the actual contact position with the reference contact position based on the offset data.

2 Claims, 4 Drawing Sheets

METHOD OF CORRECTING A POSITION OF A PROBER

BACKGROUND

1. Field

Example embodiments relate to a method of correcting a position of a prober and an apparatus for performing the same.

2. Description of the Related Art

Generally, a semiconductor device may be manufactured by performing a plurality of semiconductor fabrication processes on a semiconductor substrate. The semiconductor device may have pads as external terminals.

A prober may be used for inspecting electrical characteristics of the semiconductor device. The prober may include a plurality of needles configured to make contact with the pads. The electrical characteristics of the semiconductor device may be inspected by contacting the needles to the pads.

After contacting the needles to the pads, a contact mark may remain on the pad. When the needle does not make contact with a central portion of the pad, the contact mark may be connected with an adjacent pad, so that an electrical short between the pads may be generated.

Further, as the semiconductor device becomes more highly integrated, an interval, i.e., spacing, between the pads may become narrower. In contact such minutely arranged pads, needles arranged in a zigzag pattern may be used. The needles arranged in the zigzag pattern may make contact with both edge portions of the minutely arranged pads. However, when position of the needles is not accurately aligned, one of the adjacent needles may make contact with a central portion of the pad and the other of the adjacent needles may make contact with a boundary between the adjacent pads. Therefore, a contact mark of the needle, which may make contact with the boundary between the adjacent pads, may cause an electrical short between the pads.

SUMMARY

Embodiments are therefore directed to a method of correcting a position of a prober and an apparatus for performing the same, which substantially overcome one or more of the problems due to the limitations and disadvantages of the related art.

It is therefore a feature of an embodiment to provide a method of correcting a position of a prober that may be capable of preventing an electrical short between pads by a contact mark of the prober.

It is therefore another feature of an embodiment to provide an apparatus for performing the method.

At least one of the above and other features and advantages may be realized by providing a method of correcting a position of a prober, the method including obtaining a first image of a pad, the pad having a predetermined reference contact position, contacting the prober to the pad after obtaining the first image of the pad, obtaining a second image of the pad after contacting the prober to the pad, determining an actual contact position of an actual contact mark on the pad, the actual contact mark being produced by the contacting of the prober to the pad, comparing the second image to the first image to obtain an offset data, the offset data relating the actual contact position to the reference contact position, and correcting the position of the prober by aligning the actual contact position with the reference contact position based on the offset data.

The prober may include linearly arranged needles, and the reference contact position may correspond to a central portion of the pad.

The prober may include needles arranged in a zigzag pattern, and the reference contact position may correspond to an edge portion of the pad, the edge portion being between a side of the pad and a central portion of the pad.

The pad may be formed in a semiconductor device.

At least one of the above and other features and advantages may also be realized by providing an apparatus for correcting a position of a prober, the apparatus including an image-obtaining unit for obtaining a first image of a pad, the pad having a predetermined reference contact position, and obtaining a second image of the pad after the prober makes an actual contact mark at an actual contact position on the pad, an image-processing unit for comparing the second image with the first image to obtain an offset data, the offset data relating the actual contact position to the reference contact position, and a position-correcting unit for correcting the position of the prober by aligning the actual contact position with the reference contact position based on the offset data.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1:
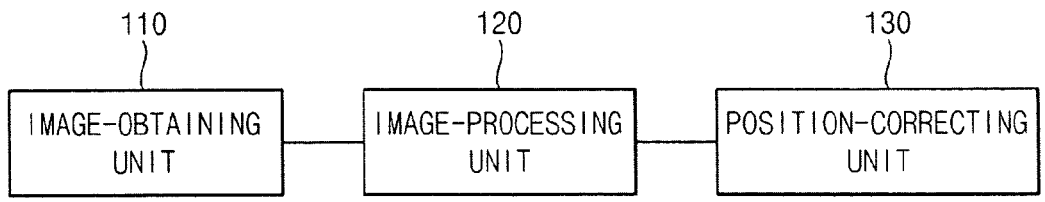
FIG. 1 illustrates a block diagram of an apparatus for correcting a position of a prober in some example embodiments.

Korean Patent Application No. 10-2009-0008227, filed on Feb. 3, 2009, in the Korean Intellectual Property Office, and entitled: "Method of Correcting a Position of a Prober and Apparatus for Performing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawing figures, dimensions may be exaggerated for clarity of illustration. Like reference numerals refer to like elements throughout.

As set forth in detail below, example embodiments relate to a method of correcting a position of a prober used for inspecting a semiconductor device, and an apparatus for performing the method. More particularly, images of a pad before and after contacting the prober to the pad may be compared with each other to obtain offset data, the offset data representing a difference, or offset, between a reference contact position and an actual contact position of the prober. The actual contact position may be aligned with the reference contact position based on the offset data to correct the position of the prober. Thus, an electrical short between the pads caused by a contact mark of the prober may be prevented.

Apparatus for Correcting a Position of a Prober

FIG. 1 illustrates a block diagram of an apparatus 100 for correcting a position of a prober in some example embodiments.

Referring to FIG. 1, the apparatus 100 for correcting a position of a prober in accordance with this example embodiment may include an image-obtaining unit 110, an image-processing unit 120, and a position-correcting unit 130.

In some example embodiments, an object inspected by the prober may include a semiconductor device. The semiconductor device may include a plurality of pads as external terminals. The prober may include a plurality of needles configured to make contact with the pads, respectively. The needles may be linearly arranged or arranged in a zigzag pattern. A prober having linearly arranged needles may be applied to a semiconductor device having pads that are arranged by a relatively wide interval, i.e., pads that are spaced apart by a relatively wide interval. In contrast, a prober having needles arranged in a zigzag pattern may be applied to a semiconductor device having pads that are arranged by a relatively narrow interval, i.e., pads that are close to one another.

The image-obtaining unit 110 may obtain a first image of the pad before the prober makes contact with the pad. Here, a reference contact position of the prober may be predetermined on the pad. Further, the image-obtaining unit 110 may obtain a second image of the pad after the prober makes contact with the pad. When the prober makes contact with the pad, a needle of the prober that contacts the pad may produce an actual contact mark on the pad. After the image-obtaining unit 110 photographs the pad before the prober has made contact with the pad, i.e., after the image-obtaining unit 100 obtains the first image, the image-obtaining unit 110 may then photograph the pad after the prober makes contact with the pad, i.e., the image-obtaining unit 100 may then obtain the second image, the second image showing the actual contact mark produced by the prober contacting the pad. Because the actual contact mark of the prober may remain on the pad after the prober makes contact with the pad, the contact mark of the prober may exist in the second image, i.e., the actual contact mark may be shown in the second image.

In some example embodiments, the reference contact position of the prober may vary in accordance with arrangements of the needles. When the prober includes the linearly arranged needles, the reference contact position of the prober may correspond to a central portion of each pad. When the prober includes the needles arranged in the zigzag pattern, the reference contact position of the prober may correspond to a first edge portion of a first pad, contiguous with a side of the first pad, and to a second edge portion of a second pad, the second edge portion being opposite the first edge portion. The needles arranged in the zigzag pattern may simultaneously make contact with the pads, the reference contact positions of the prober having a zigzag pattern corresponding to the zigzag pattern of the needles.

The image-processing unit 120 may receive the first image and the second image obtained by the image-obtaining unit 110. The image-processing unit 120 may compare the second image with the first image to obtain an offset data, the offset data representing a spatial relationship, e.g., a relationship in X and Y axis directions, between an actual contact position of the prober with respect to the reference contact position on the pad.

In some example embodiments, when the actual contact position of the prober is within an allowable range from the reference contact position, the offset data obtained by the image-processing unit 120 may be zero. When the actual contact position of the prober is beyond the allowable range from the reference contact position, the offset data may be a non-zero number. For example, the offset data may be represented as offset distances of the actual contact position from the reference contact position in lengthwise and breadthwise directions.

The position-correcting unit 130 may receive the offset data obtained by the image-processing unit 120. The position-processing unit 130 may correct the position of the prober by aligning the actual contact position with the reference contact position. In some example embodiments, the position-correcting unit 130 may correct positions of the needles in order to allow the needles to make contact with the pads within the allowable range from the reference contact position.

In some example embodiments, when the prober includes the linearly arranged needles, the position-correcting unit 130 may correct the positions of the needles in order to allow the needles to make contact with the central portions of the pads, respectively. When the prober includes the needles arranged in the zigzag pattern, the position-correcting unit 130 may correct the positions of the needles in order to allow the needles to make contact with the edge portions of the pads, respectively, the edge portions being adjacent to the sides of the pads.

The position of the prober may be corrected by aligning the actual contact position with the reference contact position based on the offset data, the offset data representing a relationship between the reference contact position and the actual contact position. By correcting the position of the prober, an electrical short between the pads caused by the contact mark of the prober may be prevented.

Method of Correcting a Position of a Prober

Figure 2:
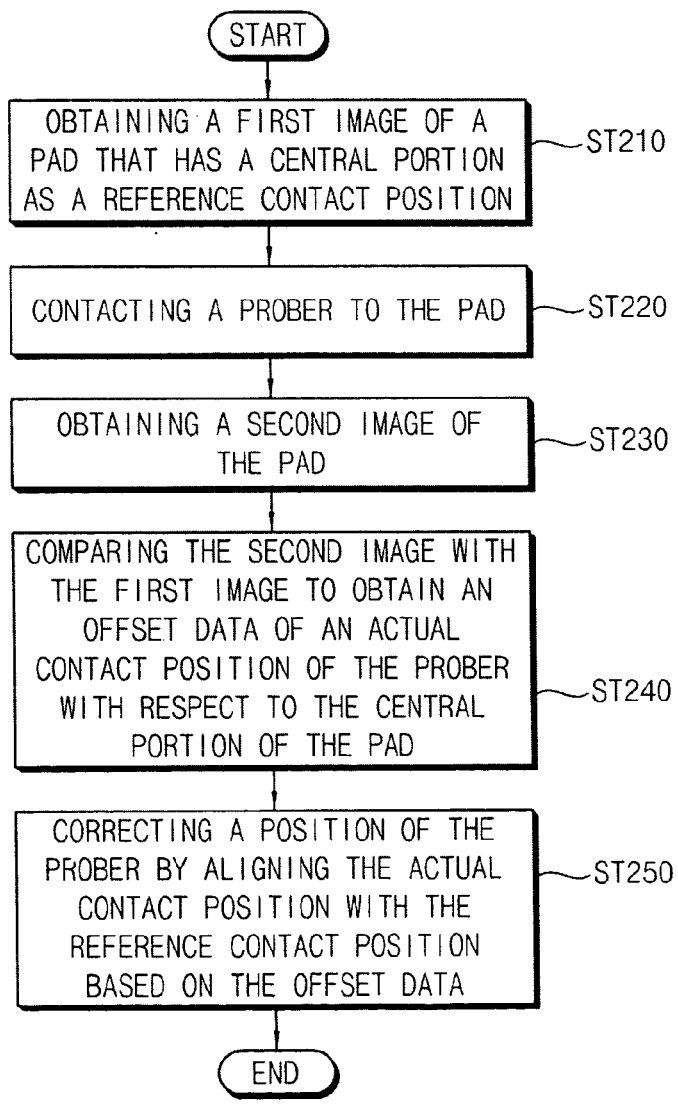
FIG. 2 illustrates a flow chart of a method of correcting a position of a prober using the apparatus in FIG. 1 in some example embodiments.
Figure 3:
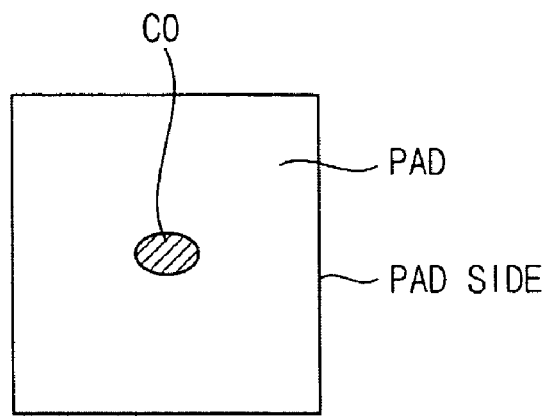
FIG. 3 illustrates a plan view of a pad before the prober contacts.
Figure 4:
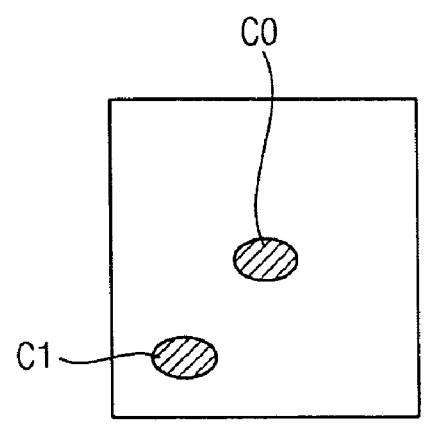
FIG. 4 illustrates a plan view of the pad after the prober contacts.

FIG. 2 illustrates a flow chart of a method of correcting a position of a prober using the apparatus in FIG. 1 in some example embodiments, FIG. 3 illustrates a plan view of a pad before the prober contacts, and FIG. 4 illustrates a plan view of the pad after the prober contacts.

In this example embodiment, the prober may include the linearly arranged needles. The needles may make contact with the central portions of the pads, respectively. Thus, the reference contact position of the needle may correspond to the central portion of the pad.

Referring to FIGS. 1 and 2, in operation ST210, the image-obtaining unit 110 may photograph the pad (before the prober makes contact with the pad) to obtain the first image of the pad (see FIG. 3). A reference contact position C0 of the prober may be predetermined on the pad. For linearly arranged probe needles, the predetermined reference contact position may correspond to the central portion of the pad.

In operation ST220, the prober may make contact with the pad, and the linearly arranged needles of the prober may make contact with the pads, respectively. As a result of the contact, an actual contact mark C1 from the probe needle may be generated on the pad (see FIG. 4).

In operation ST230, the image-obtaining unit 110 may photograph the pad (after the prober has made contact with the pad) to obtain the second image of the pad. The image-obtaining unit 110 may transmit the first image and the second image to the image-processing unit 120.

In operation ST240, the image-processing unit 120 may compare the second image with the first image to obtain the offset data, the offset data representing a relationship of the actual contact position of the actual contact mark C1 with respect to the reference contact position C0 of the pad, e.g., with respect to the central portion of the pad. The image-processing unit 120 may transmit the offset data to the position-correcting unit 130.

In some example embodiments, when the actual contact position of the prober is within an allowable range from the central portion of the pad, the offset data obtained by the image-processing unit 120 may be zero. For example, an actual contact position of the contact mark C1 that is within a predetermined X and Y-distance (i.e., within the allowable range) from the reference contact position C0 may be output as a zero offset, even though, in actuality, the actual contact position is not an exact overlay on the reference contact position C0.

When the actual contact position of the prober is beyond the allowable range from the central portion of the pad, the offset data may be a non-zero number, e.g., an X value may be non-zero, a Y value may be non-zero, or both X and Y values may be non-zero. For example, the offset data may be represented as offset distances of the actual contact position from the central portion of the pad in lengthwise and breadthwise directions.

In operation ST250, the position-correcting unit 130 may correct the position of the prober in order to allow the needles to make contact with the central portion of the pad within the allowable range.

According to this example embodiment, although the prober may make contact with a position of a first pad beyond the allowable range from the central portion of the pad, the prober may make contact with a position of a second pad within the allowable range from the central portion of the pad, after correcting the position of the prober.

Figure 5:
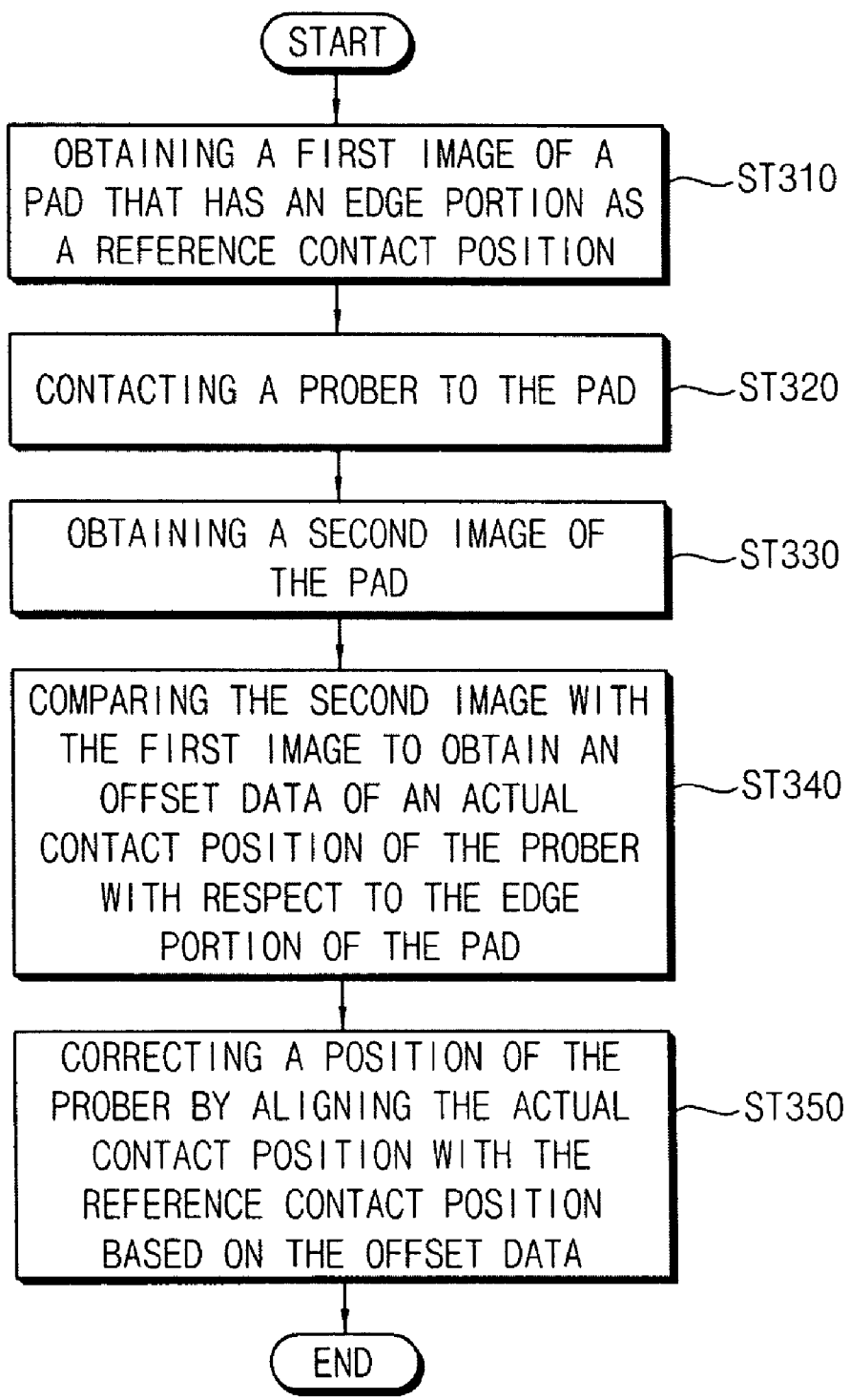
FIG. 5 illustrates a flow chart showing a method of correcting a position of a prober using the apparatus in FIG. 1 in some example embodiments.
Figure 6:
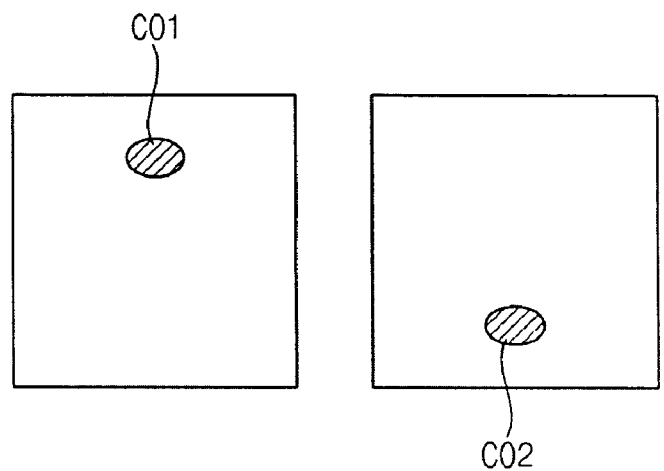
FIG. 6 illustrates a plan view of a pad before the prober contacts.
Figure 7:
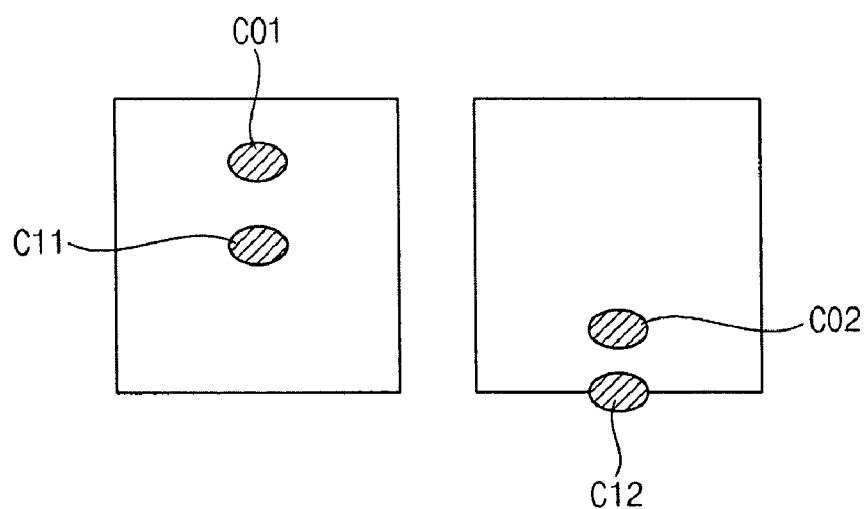
FIG. 7 illustrates a plan view of the pad after the prober contacts.

FIG. 5 illustrates a flow chart showing a method of correcting a position of a prober using the apparatus in FIG. 1 in some example embodiments, FIG. 6 illustrates a plan view of a pad before the prober contacts, and FIG. 7 illustrates a plan view of the pad after the prober contacts.

In this example embodiment, the prober may include the needles arranged in the zigzag pattern. Thus, the reference contact position C0 of the prober may correspond to an edge portion of the pad.

Referring to FIGS. 1 and 5, in operation ST310, the image-obtaining unit 110 may photograph the pad (before the prober has made contact with the pad) to obtain the first image of the pad (see FIG. 6). Reference contact positions C01 and C02 of the prober may correspond to the edge portions of the pads.

In operation ST320, the prober may make contact with the pad and the probe needles arranged in the zigzag pattern may make contact with the pads, respectively. Actual contact marks C11, C12 of the needles may be generated on the pads (see FIG. 7).

In operation ST330, the image-obtaining unit 110 may photograph the pad (after the prober has made contact with the pad) to obtain the second image of the pad. The image-obtaining unit 110 may transmit the first image and the second image to the image-processing unit 120.

In operation ST340, the image-processing unit 120 may compare the second image with the first image to obtain the offset data of the actual contact position C11 and C12 with respect to the reference contact position C01 and C02 of the pad. The image-processing unit 120 may transmit the offset data to the position-correcting unit 130.

In some example embodiments, when the actual contact position of the prober is within an allowable range from the edge portion of the pad, the offset data obtained by the image-processing unit 120 may be zero. When the actual contact position of the prober is beyond the allowable range from the edge portion of the pad, the offset data may be a non-zero number. For example, the offset data may be represented as offset distances of the actual contact position from the edge portion of the pad in lengthwise and breadthwise directions.

In operation ST350, the position-correcting unit 130 may correct the position of the prober for allowing the needles to make contact with the edge portion of the pad within the allowable range.

According to this example embodiment, although the prober may make contact with a position of a first pad beyond the allowable range from the edge portion of the pad, the prober may make contact with a position of a second pad within the allowable range from the edge portion of the pad, after correcting the position of the prober.

According to some example embodiments, the images of the pad before and after contacting the prober to the pad may be compared with each other to obtain the offset data between the reference contact position and the actual contact position. The actual contact position may be aligned with the reference contact position based on the offset data to correct the position of the prober. Thus, an electrical short between the pads caused by a contact mark of the prober may be prevented.

Exemplary embodiments have been disclosed herein, and although specific terms are employed, they are used and are to be interpreted in a generic and descriptive sense only and not for purpose of limitation. For example, the method may be embodied as an article of manufacture including a computer readable recording medium, the recording medium having recorded thereon a program for executing a method according to an embodiment. Accordingly, it will be understood by those of ordinary skill in the art that various changes in form and details may be made without departing from the spirit and scope of the present invention as set forth in the following claims.

What is claimed is:

1. A method of correcting a position of a prober, the method comprising:
   obtaining a first image of a pad, the pad having a predetermined reference contact position;
   contacting the prober to the pad after obtaining the first image of the pad;
   obtaining a second image of the pad after contacting the prober to the pad;
   determining an actual contact position of an actual contact mark on the pad, the actual contact mark being produced by the contacting of the prober to the pad;
   comparing the second image to the first image to obtain an offset data, the offset data relating the actual contact position to the reference contact position; and
   correcting the position of the prober by aligning the actual contact position with the reference contact position based on the offset data, wherein:
   the prober includes needles arranged in a zigzag pattern, and
   the reference contact position corresponds to an edge portion of the pad, the edge portion being between a side of the pad and a central portion of the pad.

2. The method as claimed in claim 1, wherein the pad is formed in a semiconductor device.

* * * * *